(12) United States Patent
Izeki et al.

(10) Patent No.: US 12,297,560 B2
(45) Date of Patent: May 13, 2025

(54) METHOD FOR MANUFACTURING MONOCRYSTALLINE SILICON BY THE CZOCHRALSKI PROCESS BY PULLING A FIRST STRAIGHT BODY HAVING A FIRST DIAMETER AND A SECOND STRAIGHT BODY HAVING A SECOND DIAMETER LARGER THAN THE FIRST DIAMETER

(71) Applicant: SUMCO CORPORATION, Tokyo (JP)

(72) Inventors: Takashi Izeki, Nagasaki (JP); Yasuhito Narushima, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 397 days.

(21) Appl. No.: 17/788,568

(22) PCT Filed: Dec. 21, 2020

(86) PCT No.: PCT/JP2020/047639
§ 371 (c)(1),
(2) Date: Jun. 23, 2022

(87) PCT Pub. No.: WO2021/132136
PCT Pub. Date: Jul. 1, 2021

(65) Prior Publication Data
US 2023/0031070 A1 Feb. 2, 2023

(30) Foreign Application Priority Data

Dec. 24, 2019 (JP) .................................. 2019-233273

(51) Int. Cl.
*C30B 15/20* (2006.01)
*C30B 15/04* (2006.01)
(Continued)

(52) U.S. Cl.
CPC ............. *C30B 29/06* (2013.01); *C30B 15/04* (2013.01); *C30B 15/22* (2013.01); *C30B 29/66* (2013.01)

(58) Field of Classification Search
CPC ......... C30B 15/00; C30B 15/02; C30B 15/04; C30B 15/14; C30B 15/20; C30B 15/22;
(Continued)

(56) References Cited

U.S. PATENT DOCUMENTS

| 5,820,672 A | 10/1998 | Bell et al. |
| 10,233,564 B2 | 3/2019 | Narushima et al. |

(Continued)

FOREIGN PATENT DOCUMENTS

| CN | 103290470 A | * 9/2013 |
| CN | 103343385 A | 10/2013 |

(Continued)

OTHER PUBLICATIONS

Office Action for CN App. No. 202080089916.2, dated May 24, 2023 (w/ translation).

(Continued)

*Primary Examiner* — Kenneth A Bratland, Jr.
(74) *Attorney, Agent, or Firm* — Greenblum & Bernstein, P.L.C.

(57) ABSTRACT

A monocrystalline silicon includes a shoulder, a straight body, and a tail. The straight body includes: a first straight body having a first diameter d1; and a second straight body provided closer to the shoulder than the first straight body is and having a second diameter d2 larger than the first diameter d1 by from 3.5% to 15%. Firstly, a resistivity at a start point of the straight body connected to the shoulder is set to a first resistivity. Subsequently, the monocrystalline silicon is pulled up and grown to form the first straight body, (Continued)

and a resistivity at a start point of the first straight body is set to a second resistivity lower than the first resistivity.

6 Claims, 7 Drawing Sheets

(51) Int. Cl.
*C30B 15/22* (2006.01)
*C30B 29/06* (2006.01)
*C30B 29/66* (2006.01)

(58) Field of Classification Search
CPC ......... C30B 29/00; C30B 29/02; C30B 29/06; C30B 29/66
USPC ............. 117/11, 13, 19, 21–22, 35, 73, 928, 117/931–932
See application file for complete search history.

(56) References Cited

U.S. PATENT DOCUMENTS

| | | |
|---|---|---|
| 10,895,018 B2 | 1/2021 | Narushima et al. |
| 10,916,425 B2 | 2/2021 | Ogawa et al. |
| 10,982,350 B2 | 4/2021 | Narushima et al. |
| 11,047,065 B2 | 6/2021 | Narushima et al. |
| 2010/0071612 A1 | 3/2010 | Narushima et al. |
| 2020/0135460 A1 | 4/2020 | Narushima et al. |
| 2020/0141024 A1 | 5/2020 | Maegawa et al. |

FOREIGN PATENT DOCUMENTS

| | | | |
|---|---|---|---|
| DE | 11 2018 002 156 T5 | 1/2020 | |
| DE | 11 2018 002 171 T5 | 2/2020 | |
| DE | 11 2018 003 320 T5 | 3/2020 | |
| JP | S62-288191 A | 12/1987 | |
| JP | H03-183684 A | 8/1991 | |
| JP | H07-300390 A | 11/1995 | |
| JP | 2007-284313 A | 11/2007 | |
| JP | 2011-005604 A | 1/2011 | |
| JP | 2018184317 A * | 11/2018 | ............. C30B 15/04 |
| KR | 10-2019-0126163 A | 11/2019 | |
| WO | 2018/198606 A1 | 11/2018 | |
| WO | 2019/003968 A1 | 1/2019 | |

OTHER PUBLICATIONS

Office Action for KR App. No. 10-2022-7020956, dated Jan. 31, 2024 (w/ translation).
Office Action for DE App. No. 11 2020 006 312.7, dated Mar. 21, 2024 (w/ translation).
IPRP for PCT/JP2020/047639, dated Jun. 28, 2022 (w/ translation).
Search Report issued in International Bureau of WIPO Patent Application No. PCT/JP2020/047639, dated Feb. 16, 2021, along with an English translation thereof.

* cited by examiner

METHOD FOR MANUFACTURING MONOCRYSTALLINE SILICON BY THE CZOCHRALSKI PROCESS BY PULLING A FIRST STRAIGHT BODY HAVING A FIRST DIAMETER AND A SECOND STRAIGHT BODY HAVING A SECOND DIAMETER LARGER THAN THE FIRST DIAMETER

TECHNICAL FIELD

The present invention relates to a manufacturing method of monocrystalline silicon using a Czochralski method (hereinafter, abbreviated as a "CZ method"), and monocrystalline silicon and a silicon wafer that are manufactured by the manufacturing method of monocrystalline silicon.

BACKGROUND ART

A power MOSFET (Metal Oxide Semiconductor Field Effect Transistor), which is used as an electric power device for a mobile device, has a predetermined intrinsic electric resistance (referred to as an "on-resistance" hereinafter) between a drain and a source while being powered on. Accordingly, the power MOSFET per se consumes power according to electric currents flowing therein while being powered on.

Accordingly, if the on-resistance of the power MOSFET can be decreased, power consumption of a mobile device can be decreased. Given such a background, in order to decrease the on-resistance of the power MOSFET, device manufacturers have strongly demanded monocrystalline silicon to which an n-type dopant typified by arsenic (As), phosphorus (P), and antimony (Sb) is added at a high concentration and whose electric resistivity (referred simply as "resistivity" hereinafter) is low.

When the CZ method is used for manufacturing monocrystalline silicon added with a dopant at a high concentration, a freezing-point depression, which is a difference between a freezing point of a silicon melt and a freezing point of a dopant-added melt that is the silicon melt added with a dopant, becomes extremely large by charging a large amount of the dopant in the silicon melt, thereby causing constitutional undercooling.

Here, constitutional undercooling will be described. On a solid-liquid interface that is a boundary between monocrystalline silicon and a dopant-added melt, a dopant concentration in the monocrystalline silicon and a dopant concentration in the dopant-added melt are in equilibrium at different values.

Accordingly, the dopant that has not been accommodated in the monocrystalline silicon is discharged into the dopant-added melt to accumulate near the solid-liquid interface, so that the dopant concentration comes into such a concentration distribution that the dopant concentration decreases exponentially from a concentration at the solid-liquid interface according to a distance from the solid-liquid interface.

A liquidus-line temperature corresponding the concentration distribution comes into such a temperature distribution that a temperature rises exponentially from a temperature on the solid-liquid interface (hereinafter, referred to as an "interface temperature") according to a distance from the solid-liquid interface. However, assuming that an actual temperature of the dopant-added melt comes into such a temperature distribution that the actual temperature rises linearly from the interface temperature according to the distance from the solid-liquid interface, the dopant-added melt has a region where the actual temperature is lower than the liquidus-line temperature.

This region can be said to be undercooled in a sense that the actual temperature is equal to or less than the liquidus-line temperature. However, this undercooling is not due to temperature changes, but due to changes in composition. Therefore, this undercooling is called constitutional undercooling.

When constitutional undercooling occurs, a region away from the solid-liquid interface is undercooled more than the solid-liquid interface, and a solidification rate in the region away from the solid-liquid interface is also faster than in the solid-liquid interface. When slight convex and concave portions are formed on the solid-liquid interface in such a state, crystal grows faster in the convex portion, so that the slight convex and concave portions are amplified to form a cell structure and further a dendrite structure in which convex and concave portions are formed on a side surface of the cell structure.

When such an abnormal crystal growth different from a normal crystal growth occurs at a growth stage of monocrystalline silicon, crystal is no longer monocrystal. Accordingly, manufacturing of monocrystalline silicon cannot be continued any more.

A solution for this problem is exemplified by a manufacturing method of monocrystalline silicon disclosed in Patent Literature 1. This manufacturing method of monocrystalline silicon includes pulling up and growing monocrystalline silicon by the CZ method from a dopant-added melt containing red phosphorus as a main dopant.

In this manufacturing method of monocrystalline silicon, a resistivity at a straight-body start point of the monocrystalline silicon is controlled to a range from 0.80 mΩcm to 1.05 mΩcm, and subsequently the resistivity of the monocrystalline silicon is decreased as the monocrystalline silicon is pulled up and grown, whereby a resistivity at a part of the monocrystalline silicon is set in a range from 0.5 mΩcm to 0.7 mΩcm.

In this manufacturing method of the monocrystalline silicon, in order to increase the dopant concentration in the dopant-added melt, a dopant is added during the pull-up of the monocrystalline silicon, an increase in the dopant concentration due to segregation phenomenon accompanying the pull-up of the monocrystalline silicon is employed, evaporation of the dopant is suppressed by changing an introduction amount of inert gas introduced into the chamber, or a pressure in a chamber (furnace internal pressure) is changed.

CITATION LIST

Patent Literature(s)

Patent Literature 1: JP2018-184317 A (claim 1, paragraph 0022, and paragraph 0023)

SUMMARY OF THE INVENTION

Problem(s) to be Solved by the Invention

A related art described in Patent Literature 1 can manufacture monocrystalline silicon having an extremely low resistivity of 0.6 mΩcm or less in a region from 60%-point from a straight-body start point to a tail in the monocrystalline silicon having red phosphorus as a dopant, while preventing occurrence of dislocations at the straight-body start point (see paragraph 0027 to paragraph 0030, paragraph 0032, FIGS. 2 and 3 of Patent Literature 1).

However, even when the dopant concentration in the dopant-added melt is adjusted so as to achieve a target resistivity and pull-up of monocrystalline silicon is started using the related art described in Patent Literature 1, only a small part satisfying the target resistivity can be obtained, resulting in a decrease in a yield rate.

Therefore, there has been desired for a method of manufacturing monocrystalline silicon at a high yield rate, the monocrystalline silicon having a low resistivity and added with an n-type dopant at a high concentration.

In the invention, the problem to be solved by the invention is, for instance, to solve the above-described disadvantage. An object of the invention is to provide a manufacturing method of monocrystalline silicon, monocrystalline silicon, and silicon wafer capable of solving this problem.

Means for Solving the Problems

A general method of manufacturing monocrystalline silicon having a low resistivity and added with an n-type dopant at a high concentration without occurrence of an abnormal crystal growth in the monocrystalline silicon is exemplified by (1) a method of slowing a pull-up speed of monocrystalline silicon and (2) a method of increasing a temperature gradient in an axial direction of monocrystalline silicon.

When the method (1) is used, since a manufacturing period of monocrystalline silicon becomes long, an evaporation amount of a dopant that evaporates from a dopant-added melt increases depending on a length of the manufacturing period, resulting in an increase in the resistivity of the manufactured monocrystalline silicon. Therefore, there is limitation in decreasing the resistivity of the monocrystalline silicon.

In order to use the method (2), components in the chamber (hereinafter, referred to as "furnace internals") need to be re-designed, involving cost. For instance, it is necessary to increase an amount of a heat insulation material of a heat shield for shielding radiation heat transmitting to monocrystalline silicon from a heater heating a silicon melt, dispose a cooling cylinder for forcibly cooling the monocrystalline silicon, and narrow a gap between the heat shield and the dopant-added melt. Moreover, depending on structures of the furnace internals, the problem cannot be solved only by altering the design. Therefore, there is limitation in decreasing the resistivity of the monocrystalline silicon.

After dedicated studies, the inventors have reached the following findings. As pull-up of the monocrystalline silicon proceeds, the monocrystalline silicon grows in an axial direction (i.e., crystal length direction). Since a residual amount of the dopant-added melt in a crucible decreases as the monocrystalline silicon grows, a solidification ratio per crystal-length-directional length of the monocrystalline silicon increases as a crystal length of the monocrystalline silicon increases, as shown in FIG. 6(*a*).

Herein, the solidification ratio refers to a ratio of a pulled-up weight of the monocrystalline silicon relative to an amount of a silicon material charged in the crucible (hereinafter, referred to as a "charge amount").

Meanwhile, since segregation coefficients of most dopants are less than 1, a dopant concentration in the dopant-added melt increases due to a segregation phenomenon as the residual amount of the dopant-added melt in the crucible decreases as pull-up of the monocrystalline silicon proceeds. Therefore, a resistivity per crystal-length-directional length of the monocrystalline silicon decreases as the crystal length of the monocrystalline silicon increases, as shown in FIG. 6(*b*).

Here, a case where the charge amount is a typical amount and a diameter of an entire straight body of the monocrystalline silicon is larger than a typical diameter (hereinafter, referred to as "diameter-increase case") will be examined. In this case, since a consumption amount of the dopant-added melt per crystal-length-directional length of the monocrystalline silicon increases, the length of the monocrystalline silicon decreases. For instance, when the charge amount is 100 kg, a length of the straight body is 1150 mm while a diameter of the straight body is 205 mm, and the length of the straight body is 1075 mm while the diameter of the straight body is 212 mm.

According to this, an inclination of a characteristic line representing a relationship between the solidification ratio per crystal-length-directional length of the monocrystalline silicon and the crystal length is larger in the diameter-increase case as shown in a solid line in FIG. 7(*a*) than in a case where the diameter is not increased (diameter-non-increase case) (shown in two-dot chain line in FIG. 7(*a*)).

On the other hand, an inclination of a characteristic curve representing a relationship between the resistivity per crystal-length-directional length of the monocrystalline silicon and the crystal length is larger in the diameter-increase case as shown in a solid line in FIG. 7(*b*) than in the case where the diameter is not increased (shown in two-dot chain line in FIG. 7(*b*)). Consequently, a final resistivity of the straight body in the diameter-increase case is lower than a final resistivity of the straight body in the diameter-non-increase case.

In the diameter-increase case of the monocrystalline silicon as compared with the diameter-non-increase case of the monocrystalline silicon, an exposed area of the dopant-added melt held in the crucible decreases (when the crucible having the same inner diameter is used) and a manufacturing period of the monocrystalline silicon decreases, so that an evaporation amount of the dopant evaporating from the dopant-added melt decreases depending on the decreased amount of the exposed area and the decreased length of the manufacturing period. As a result, as shown in FIG. 7(*b*), the resistivity of the monocrystalline silicon in the diameter-increase case is lower than the resistivity of the monocrystalline silicon in the diameter-non-increase case.

When the charge amount is 100 kg, the manufacturing period of monocrystalline silicon having a straight body with a 212-mm diameter is shorter by about three hours than that of monocrystalline silicon having a straight body with a 202-mm diameter. However, since the length of the straight body in the diameter-increase case is shorter than the length of the straight body in the diameter-non-increase case as described above, the number of wafers acquirable from the straight body in the diameter-increase case naturally decreases. Therefore, it is preferable to increase the length of the straight body without increasing the diameter in terms of increasing the number of wafers to be acquired.

From the foregoing, the inventors reached findings that, using a typical amount as the charge amount, monocrystalline silicon 1 only needs to be manufactured to have a shape including a shoulder 1A, a straight body 1B, and a tail 10 as shown in FIG. 1. In other words, the inventions reached findings that after sufficiently decreasing the resistivity of the straight body by forming the straight body having an increased diameter, forming the straight body whose the increased diameter is decreased can provide a longer straight body having a low resistivity.

A straight body 1B includes: a first straight body 1BA having a diameter d1 a diameter-reduced portion 1BB, and a second straight body 1BC having a diameter d2. The diameter d1 is defined as a value larger by 1% to 5% than a diameter d0 of a silicon wafer as a commercialized product (hereinafter, referred to as a "product diameter d0"). The diameter d2 is defined as a value larger by 3.5% to 15% than the diameter d1, more preferably a value larger by 3.5% to 10%. In short, d0<d1<d2 is satisfied.

When the diameter d1 is a value larger by less than 1% than the product diameter d0, in other words, the diameter d1 is too close to the product diameter d0, the resistivity cannot be decreased to the target value, and a diameter of the first straight body 1BA actually obtained due to a diameter change at the time of pulling up the monocrystalline silicon is highly likely to be below the product diameter d0, so that a wafer product may not be obtained.

On the other hand, when the diameter d1 is set to a value larger by more than 5% than the diameter d0, the resistivity is too low, so that a product yield of monocrystalline silicon having a target resistivity region decreases and the length of the first straight body 1BA decreases. Accordingly, the effects of the invention of obtaining a longer straight body having a low resistivity cannot be sufficiently obtained.

When the diameter d2 is set to a value larger by less than 3.5% relative to the diameter d1, the effects of the invention cannot be sufficiently obtained. For instance, the resistivity cannot be decreased to the target value and monocrystal having a desired low resistivity may not be obtained. When the diameter d2 is set to a value larger by more than 15% than the diameter d1, risk of dislocations caused by contact of the monocrystalline silicon with the heat shield increases, and a grinding margin used for grinding an outer circumference of the second straight body 1BC to the product diameter d0 increases, resulting a large grinding loss. Accordingly, the diameter d2 is preferably 15% or less relative to the diameter d1. The diameter d2 is further preferably 10% or less relative to the diameter d1.

Specifically, most parts of the first straight body 1BA are considered to have the target resistivity by forming the first straight body 1BA after a formation step of the second straight body 1BC. The formation step of the second straight body 1BC includes: increasing the consumption amount of the dopant-added melt per crystal-length-directional length of the monocrystalline silicon to increase the solidification ratio per crystal-length-directional length of the monocrystalline silicon; and increasing the dopant concentration in the dopant-added melt due to the segregation phenomenon to considerably decrease the resistivity of a bottom portion of the second straight body 1BC.

In order to solve the above problem, a manufacturing method of monocrystalline silicon according to an aspect of the invention includes: pulling up monocrystalline silicon from a dopant-added melt in which a dopant is added to a silicon melt and growing the monocrystalline silicon according to Czochralski process, in which the monocrystalline silicon includes a shoulder, a straight body, and a tail that are sequentially connected, and the straight body includes: a first straight body having a first diameter; and a second straight body provided closer to the shoulder than the first straight body is and having a second diameter larger than the first diameter; setting a resistivity at a start point of the straight body connected to the shoulder to a first resistivity; and subsequently, pulling up and growing the monocrystalline silicon to form the first straight body, and concurrently setting a resistivity at a start point of the first straight body to a second resistivity lower than the first resistivity.

The term "intentionally" is used herein for excluding cases where monocrystalline silicon is often formed with a diameter unintentionally increased due to an unfavorable diameter-controllability in a transition from a shoulder-formation step to a straight-body-formation step.

The invention is a manufacturing method of monocrystalline silicon suitable for especially manufacturing, at a high yield rate, an n-type monocrystalline silicon having an extremely low resistivity of 2.0 mΩcm or less.

In the manufacturing method of monocrystalline silicon according to the above aspect of the invention, the second diameter is larger than the first diameter by from 3.5% to 15%.

A manufacturing method of monocrystalline silicon according to another aspect of the invention includes: pulling up monocrystalline silicon from a dopant-added melt in which red phosphorus as a dopant is added to a silicon melt and growing the monocrystalline silicon according to Czochralski process, the monocrystalline silicon used for manufacturing a wafer having a diameter of 200 mm, in which the monocrystalline silicon comprises a shoulder, a straight body, and a tail that are sequentially connected, and the straight body comprises: a first straight body having a first diameter; and a second straight body provided closer to the shoulder than the first straight body is and having a second diameter larger than the first diameter by from 3.5% to 15%; setting a resistivity at a start point of the straight body connected to the shoulder to a range from 0.8 mΩcm to 1.05 mΩcm, and subsequently, pulling up and growing the monocrystalline silicon to form the first straight body, and concurrently setting a resistivity at a part of the first straight body to a range from 0.5 mΩcm to 0.7 mΩcm.

A manufacturing method of monocrystalline silicon according to still another aspect of the invention includes: pulling up monocrystalline silicon from a dopant-added melt in which arsenic as a dopant is added to a silicon melt and growing the monocrystalline silicon according to Czochralski process, the monocrystalline silicon used for manufacturing a wafer having a diameter of 200 mm, in which the monocrystalline silicon comprises a shoulder, a straight body, and a tail that are sequentially connected, and the straight body comprises: a first straight body having a first diameter; and a second straight body provided closer to the shoulder than the first straight body is and having a second diameter larger than the first diameter by from 3.5% to 15%; setting a resistivity at a start point of the straight body connected to the shoulder to a range from 1.9 mΩcm to 2.3 mΩcm, and subsequently, pulling up and growing the monocrystalline silicon to form the first straight body, and concurrently setting a resistivity at a part of the first straight body to a range from 1.2 mΩcm to 1.4 mΩcm.

A manufacturing method of monocrystalline silicon according to a further aspect of the invention includes: pulling up monocrystalline silicon from a dopant-added melt in which red phosphorus as a dopant is added to a silicon melt and growing the monocrystalline silicon according to Czochralski process, the monocrystalline silicon used for manufacturing a wafer having a diameter of 300 mm, in which the monocrystalline silicon includes a shoulder, a straight body, and a tail that are sequentially connected, and the straight body includes: a first straight body having a first diameter; and a second straight body provided closer to the shoulder than the first straight body is and having a second diameter larger than the first diameter by from 3.5% to 15%; setting a resistivity at a start point of the straight body connected to the shoulder to a range from 1.2 mΩcm to 1.7 mΩcm, and subsequently, pulling up and growing the monocrystalline silicon to form the first straight body, and setting a resistivity at a part of the first straight body to a range from 0.8 mΩcm to 1.0 mΩcm.

A manufacturing method of monocrystalline silicon according to a still further aspect of the invention includes: pulling up monocrystalline silicon from a dopant-added melt in which arsenic as a dopant is added to a silicon melt and growing the monocrystalline silicon according to Czochralski process, the monocrystalline silicon used for manufacturing a wafer having a diameter of 300 mm, in which the monocrystalline silicon comprises a shoulder, a straight body, and a tail that are sequentially connected, and the straight body comprises: a first straight body having a first diameter; and a second straight body provided closer to the shoulder than the first straight body is and having a second diameter larger than the first diameter by from 3.5% to 15%; setting a resistivity at a start point of the straight body connected to the shoulder to a range from 2.5 mΩcm to 3.1 mΩcm, and subsequently, pulling up and growing the monocrystalline silicon to form the first straight body, and setting a resistivity at a part of the first straight body to a range from 1.7 mΩcm to 2.0 mΩcm.

In the manufacturing method of monocrystalline silicon according to the above aspect of the invention, in forming the first straight body, evaporation of the dopant from the dopant-added melt is more promoted than in forming the second straight body.

According to a still further aspect of the invention, monocrystalline silicon for manufacturing a wafer having a diameter of 200 mm, the monocrystalline silicon including a shoulder, a straight body, and a tail that are sequentially connected, in which the straight body includes: a first straight body having a first diameter; and a second straight body having a second diameter larger than the first diameter by from 3.5% to 15%, the first straight body has a part having a resistivity in a range from 0.5 mΩcm to 0.7 mΩcm, and the second straight body is in a position closer to the shoulder than the first straight body is.

According to a still further aspect of the invention, monocrystalline silicon for manufacturing a wafer having a diameter of 200 mm, the monocrystalline silicon including a shoulder, a straight body, and a tail that are sequentially connected, in which the straight body includes: a first straight body having a first diameter; and a second straight body having a second diameter larger than the first diameter by from 3.5% to 15%, the first straight body has a part having a resistivity in a range from 1.2 mΩcm to 1.4 mΩcm, and the second straight body is in a position closer to the shoulder than the first straight body is.

According to a still further aspect of the invention, monocrystalline silicon for manufacturing a wafer having a diameter of 300 mm, the monocrystalline silicon including a shoulder, a straight body, and a tail that are sequentially connected, in which the straight body includes: a first straight body having a first diameter; and a second straight body having a second diameter larger than the first diameter by from 3.5% to 15%, the first straight body has a part having a resistivity in a range from 0.8 mΩcm to 1.0 mΩcm, and the second straight body is in a position closer to the shoulder than the first straight body is.

According to a still further aspect of the invention, monocrystalline silicon for manufacturing a wafer having a diameter of 300 mm, the monocrystalline silicon including a shoulder, a straight body, and a tail that are sequentially connected, in which the straight body includes: a first straight body having a first diameter; and a second straight body having a second diameter larger than the first diameter by from 3.5% to 15%, the first straight body has a part having a resistivity in a range from 1.7 mΩcm to 2.0 mΩcm, and the second straight body is in a position closer to the shoulder than the first straight body is.

A silicon wafer according to a still further aspect of the invention is cut out from the first straight body of the monocrystalline silicon according to the above aspect and has the resistivity in a range from 0.5 mΩcm to 0.7 mΩcm.

A silicon wafer according to a still further aspect of the invention is cut out from the first straight body of the monocrystalline silicon according to the above aspect and has the resistivity in a range from 1.2 mΩcm to 1.4 mΩcm.

A silicon wafer according to a still further aspect of the invention is cut out from the first straight body of the monocrystalline silicon according to the above aspect and has the resistivity in a range from 0.8 mΩcm to 1.0 mΩcm.

A silicon wafer according to a still further aspect of the invention is cut out from the first straight body of the monocrystalline silicon according to the above aspect and has the resistivity in a range from 1.7 mΩcm to 2.0 mΩcm.

EFFECTS OF THE INVENTION

According to the above aspects of the invention, monocrystalline silicon having a low resistivity and added with a dopant at a high concentration can be manufactured at a high yield rate.

DESCRIPTION OF EMBODIMENT(S)

Figure 2:
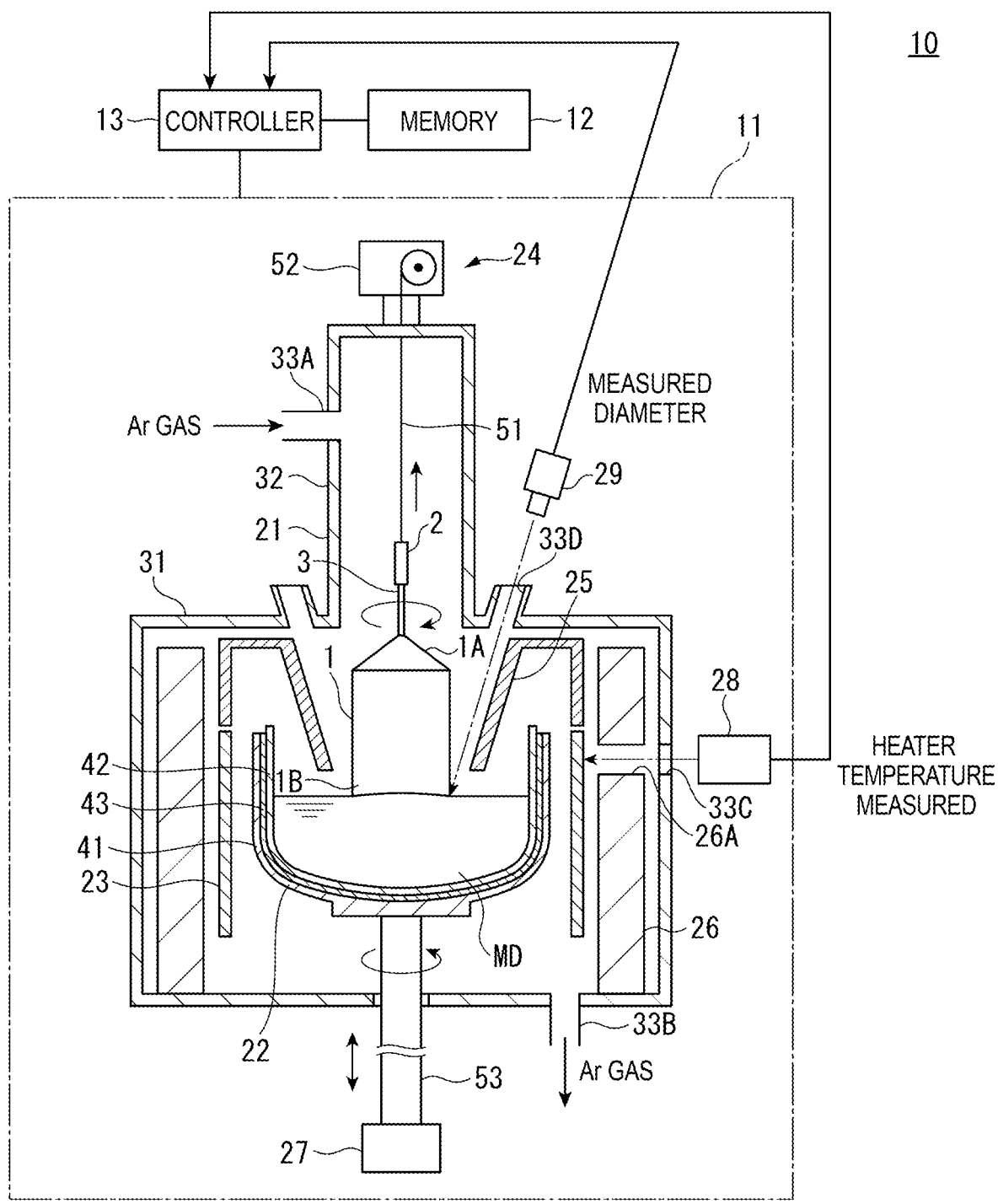
FIG. 2 is a conceptual illustration showing an example of a structure of a semiconductor crystal manufacturing device to which a manufacturing method of monocrystalline silicon according to an exemplary embodiment of the invention is applied.

An exemplary embodiment of the invention will be described below with reference to the attached drawings.
Structure of Semiconductor Crystal Manufacturing Device FIG. 2 is a conceptual illustration showing an example of a structure of a semiconductor crystal manufacturing device 10 to which a manufacturing method of monocrystalline silicon according to an exemplary embodiment of the invention is applied. The semiconductor crystal manufacturing device 10 manufactures monocrystalline silicon using the CZ method.

The semiconductor crystal manufacturing device 10 includes: a device main body 11, a memory 12, and a controller 13. The device main body 11 includes a chamber 21, a crucible 22, a heater 23, a pull-up unit 24, a heat shield 25, a heat insulation material 26, a crucible driver 27, a thermometer 28, and a diameter sensor 29.

The chamber 21 includes a main chamber 31 and a pull chamber 32 connected to an upper portion of the main chamber 31. A gas inlet 33A through which an inert gas such as argon (Ar) gas is introduced into the chamber 21 is provided in an upper portion of the pull chamber 32. A gas outlet 33B through which gas in the chamber 21 is discharged by driving a vacuum pump (not shown) is provided in a lower portion of the main chamber 31.

An inert gas introduced in the chamber 21 from the gas inlet 33A flows down between the on-growing monocrystalline silicon 1 and the heat shield 25 and flows through a space between a lower end of the heat shield 25 and a surface of the dopant-added melt MD, subsequently flows between the heat shield 25 and an inner wall of the crucible 22, further flows toward an outside of the crucible 22, subsequently flows down along the outside of the crucible 22, and is discharged from the gas outlet 33B.

The crucible 22 is disposed in the main chamber 31 and stores the dopant-added melt MD. The crucible 22 includes a support crucible 41, a quartz crucible 42 housed in the support crucible 41, and a graphite sheet 43 placed between the support crucible 41 and the quartz crucible 42. It should be noted that the graphite sheet 43 may not be disposed.

The support crucible 41 is formed of, for instance, graphite or carbon-fiber reinforced carbon. The support crucible 41 may be subjected to, for instance, a silicon carbide (SiC) surface treatment or a pyrolytic carbon coating treatment. A main component of the quartz crucible 42 is silicon dioxide ($SiO_2$). The graphite sheet 43 is formed of, for instance, exfoliated graphite.

The heater 23 is disposed outside of the crucible 22 with a predetermined distance therefrom and is configured to heat the dopant-added melt MD in the crucible 22. The pull-up unit 24 includes: a cable 51 having an end to which a seed crystal 2 is attached; and a pull up drive unit 52 configured to raise, lower and rotate the cable 51.

The heat shield 25, at least a surface thereof, is formed of a carbon material. The heat shield 25 is provided surrounding the monocrystalline silicon 1 when the monocrystalline silicon 1 is manufactured. The heat shield 25 shields the on-growing monocrystalline silicon 1 from radiation heat from the dopant-added melt MD in the crucible 22, the heater 23 and a side wall of the crucible 22, and also prevents outward heat diffusion from a solid-liquid interface, which is an interface on which crystal grows, and a vicinity thereof, whereby the heat shield 25 serves to control a temperature gradient of a central portion and an outer peripheral portion of the monocrystalline silicon 1 in a pull-up axial direction.

The heat insulation material 26 is substantially cylindrical and formed of a carbon material (e.g., graphite). The heat insulation material 26 is disposed outside of the heater 23 with a predetermined distance therefrom. The crucible driver 27 includes a support shaft 53 supporting crucible 22 from below and rotates, raises, and lowers the crucible 22 at a predetermined speed.

The thermometer 28 is exemplified by a radiation thermometer and a two-color thermometer. The thermometer 28 measures a temperature of the heater 23 at predetermined time intervals through an observation window 33C drilled in a side surface of the main chamber 31 and a through hole 26A drilled in the heat insulation material 26, and supplies the measured value (heater temperature measured) to the controller 13.

The diameter sensor 29 is exemplified by a CCD camera and a radiation thermometer. The diameter sensor 29 measures a diameter of the monocrystalline silicon 1 near the solid-liquid interface at predetermined time intervals through an observation window 33D drilled in an upper surface of the main chamber 31, and supplies the measured value (measured diameter) to the controller 13.

The memory 12 stores various information necessary for manufacturing the monocrystalline silicon 1. Examples of the various information include gas flow rate of Ar gas and a furnace internal pressure in the chamber 21, electric power supplied to the heater 23, rotation speeds of the crucible 22 and the monocrystalline silicon 1, and a position of the crucible 22. The memory 12 stores, for instance, a diameter profile table, a resistivity profile table, a pull-up speed profile table, and a heater temperature profile table.

The diameter profile table includes information on target diameters to be obtained when a piece of monocrystalline silicon 1 is manufactured using the CZ method. In the exemplary embodiment, since the monocrystalline silicon 1 is manufactured in a shape shown in FIG. 1, the diameter profile table at least includes the diameter d1 of the first straight body 1 BA and the diameter d2 of the second straight body 1BC shown in FIG. 1.

The resistivity profile table includes information on target resistivities to be obtained across the whole length of the monocrystalline silicon 1. An example of the resistivity profile regarding the straight body 1B of the monocrystalline silicon 1 is shown in an upper part of FIG. 3.

Figure 3:
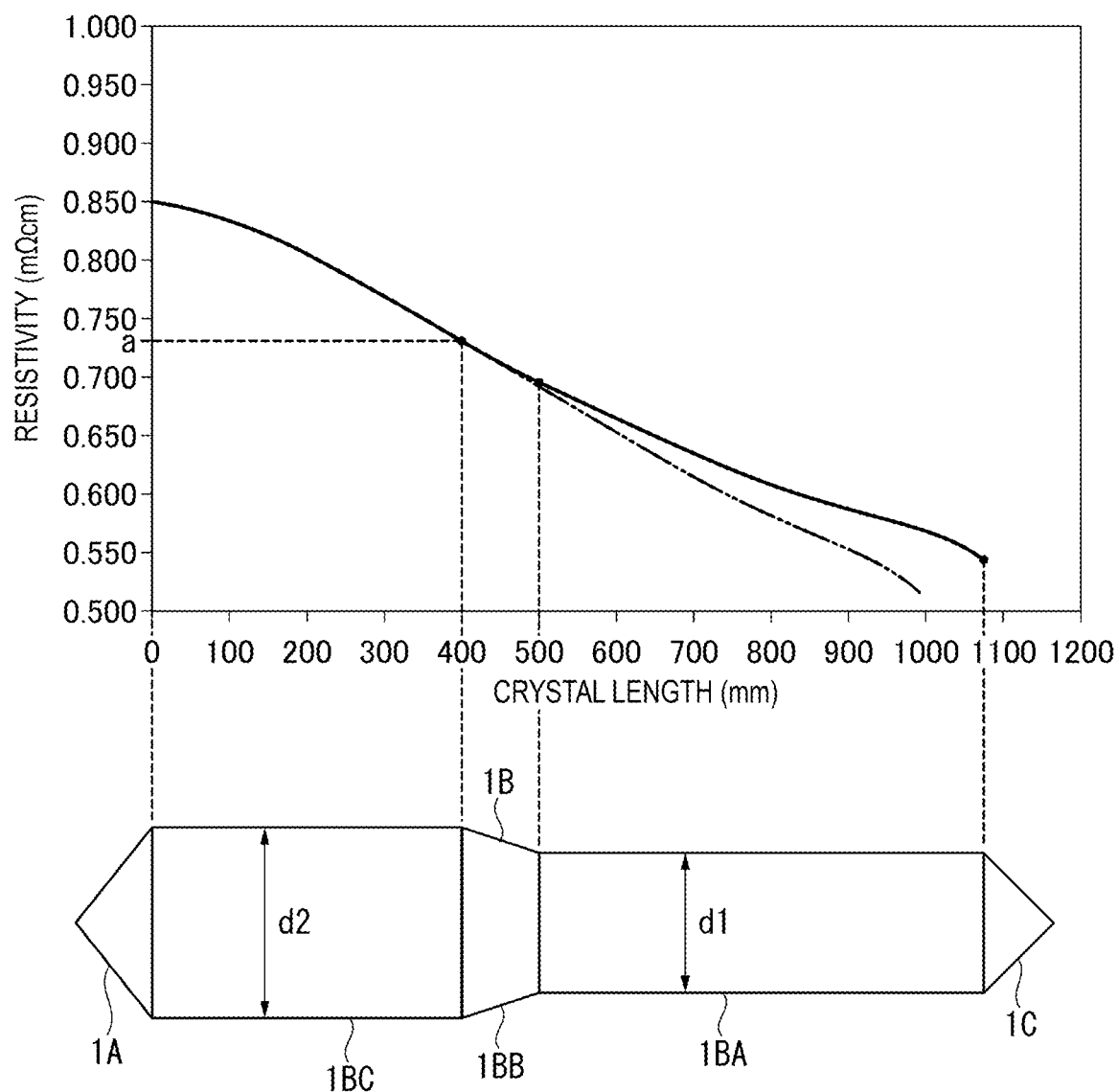
FIG. 3 is an illustration showing a corresponding relationship between an exemplary resistivity profile supposed to be obtained when monocrystalline silicon is manufactured by the manufacturing method of monocrystalline silicon according to an exemplary embodiment of the invention and an example of a structure of the monocrystalline silicon.

In the upper part of FIG. 3, the resistivity profile shows characteristics of the resistivity corresponding to the crystal length of the monocrystalline silicon 1. In the example of the resistivity profile shown in FIG. 3, the diameter d2 of the second straight body 1BC is 220 mm and the diameter d1 of the first straight body 1BA is 205 mm. The crystal length of the second straight body 1BC is 400 mm. The crystal length of the first straight body 1BA is 575 mm.

In the resistivity profile shown in FIG. 3, a two-dot chain line shows characteristics of the resistivity corresponding to the crystal length of the monocrystalline silicon 1 when the entire straight body 1B is manufactured with the diameter d2. In other words, if the diameter-reduced portion 1BB and the first straight body 1BA are not formed, the resistivity of the bottom portion of the straight body 1B is too lower than the target value. However, in the exemplary embodiment, since the diameter-reduced portion 1BB and the first straight body 1BA are formed, the resistivity of the bottom portion of the first straight body 1 BA can be kept at the target value.

Here, an example of a preparation method of the resistivity profile will be described. Prior to pulling up the monocrystalline silicon 1, the resistivity profile can be calculated in consideration of, for instance, the dopant concentration in the dopant-added melt MD at the start of pulling up the monocrystalline silicon 1, a decrease in the dopant concentration in the dopant-added melt MD due to evaporation of the dopant from the dopant-added melt MD, and an increase in the dopant concentration in the dopant-added melt MD due to the segregation phenomenon accompanying a progress of pulling up the monocrystalline silicon 1.

Moreover, based on the calculated resistivity profile, a resistivity distribution of the monocrystalline silicon 1 in a longitudinal direction is measured and the measurement result is fed back to calculation of the resistivity profile, so that an accuracy of the calculation of the resistivity profile is improvable.

In FIG. 3, the resistivity a is a resistivity at which formation of the diameter-reduced portion 1BB should be started. The resistivity a is set so that a resistivity of at least a part of the first straight body 1BA becomes a desired low resistivity.

The pull-up speed profile table includes information on target pull-up speeds to be obtained across the whole length of the monocrystalline silicon 1. The heater temperature profile table includes information on target heater temperatures to be obtained across the whole length of the monocrystalline silicon 1.

The controller 13 controls each of components on a basis of the various information stored in the memory 12 and a user's operation, thereby manufacturing the monocrystalline silicon 1.

Manufacturing Method of Monocrystalline Silicon

Next, an example of a manufacturing method of monocrystalline silicon using the semiconductor crystal manufacturing device 10 having the above-described structure will be described. In an exemplary embodiment, a case where monocrystalline silicon 1 is manufactured to have a 200-mm product diameter d0 and a case where monocrystalline silicon 1 is manufactured to have a 300-mm product diameter d0 are exemplarily shown.

When the product diameter d0 is 200 mm, the diameter d1 of the first straight body 1BA is 205 mm and the diameter d2 of the second straight body 1BC is 220 mm. When the product diameter d0 is 300 mm, the diameter d1 of the first straight body 1BA is 308 mm and the diameter d2 of the second straight body 1BC is 330 mm.

Examples of the volatile n-type dopant to be added include phosphorus (P), arsenic (As), and antimony (Sb). In this exemplary embodiment, cases where red phosphorus (P) and arsenic (As) are used are exemplarily shown.

Specifically, in the exemplary embodiment, (i) a case where the product diameter d0 is 200 mm and a main dopant is red phosphorus (P), (ii) a case where the product diameter d0 is 200 mm and a main dopant is arsenic (As), (iii) a case where the product diameter d0 is 300 mm and a main dopant is red phosphorus (P), and (iv) a case where the product diameter d0 is 300 mm and a main dopant is arsenic (As) are exemplarily shown.

Figure 4:
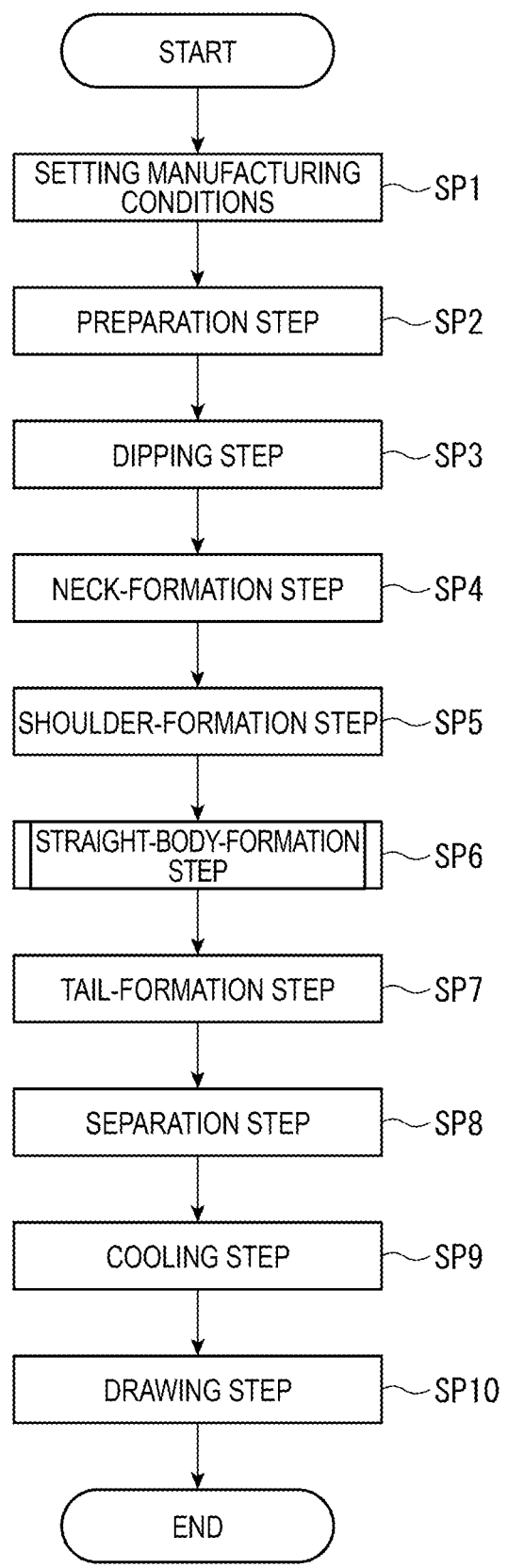
FIG. 4 is a flowchart for demonstrating an example of a manufacturing method of monocrystalline silicon according to an exemplary embodiment of the invention.

Next, an example of a manufacturing method of monocrystalline silicon using the semiconductor crystal manufacturing device 10 having the above-described structure will be described with reference to the flowcharts shown in FIGS. 4 and 5. Firstly, the controller 13 proceeds to the process of Step SP1 as shown in FIG. 4 to set manufacturing conditions of the monocrystalline silicon 1. Subsequently, the controller 13 proceeds to Step SP2.

Examples of the manufacturing conditions of the monocrystalline silicon 1 include a resistivity, an oxygen concentration in the monocrystalline silicon 1, a gas flow rate of Ar gas, a furnace internal pressure, rotation speeds of the crucible 22 and the monocrystalline silicon 1, and a position of the crucible 22. The manufacturing conditions may be input by an operator's operating an operation unit (not shown) or may be calculated by the controller 13 on a basis of the target resistivity and the like input by the operator.

Figure 1:
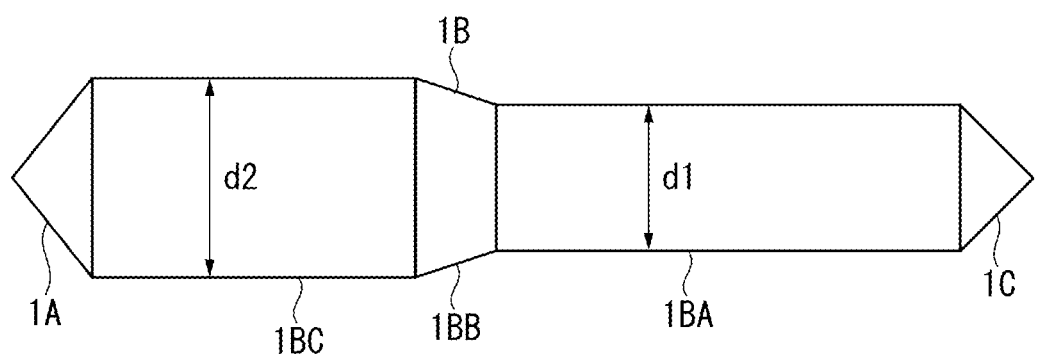
FIG. 1 is a conceptual illustration showing an example of a structure of monocrystalline silicon for demonstrating findings of the invention.

The target resistivity of a top portion of the straight body 1B is set as follows in the cases (i) to (iv). The top portion of the straight body 1B herein means a boundary between the shoulder 1A and the straight body 1B as shown in FIG. 1 and concurrently a point where formation of the straight body 1B starts in the later-described straight-body-formation step (Step SP6) (hereinafter, referred to as a "straight-body start point").

(i) When the product diameter d0 is 200 mm, the main dopant is red phosphorus (P), and the resistivity of a part of the first straight body 1BA is in a range from 0.5 mΩcm to 0.7 mΩcm, the target resistivity at the straight-body start point is set in a range from 0.8 mΩcm to 1.05 mΩcm. In this case, when the target resistivity at the straight-body start point is less than 0.8 mΩcm, dislocations are likely to occur at an initial formation stage of the straight body forming the monocrystalline silicon, so that a product yield may decrease. When the target resistivity at the straight-body start point is more than 1.05 mΩcm, the resistivity to decrease with the progress of pulling up the monocrystalline silicon may not decrease to the target low resistivity (0.7 mΩcm or less) of the first straight body 1BA.

(ii) When the product diameter d0 is 200 mm, the main dopant is arsenic (As), and the resistivity of a part of the first straight body 1BA is in a range from 1.2 mΩcm to 1.4 mΩcm, the target resistivity at the straight-body start point is set in a range from 1.9 mΩcm to 2.3 mΩcm.

(iii) When the product diameter d0 is 300 mm, the main dopant is red phosphorus (P), and the resistivity of a part of the first straight body 1BA is in a range from 0.8 mΩcm to 1.0 mΩcm, the target resistivity at the straight-body start point is set in a range from 1.2 mΩcm to 1.7 mΩcm.

(iv) When the product diameter d0 is 300 mm, the main dopant is arsenic (As), and the resistivity of a part of the first straight body 1BA is in a range from 1.7 mΩcm to 2.0 mΩcm, the target resistivity at the straight-body start point is set in a range from 2.5 mΩcm to 3.1 mΩcm.

When the target resistivity at the start point of the straight body 1B is too low, dislocations are likely to occur due to the constitutional undercooling until the target resistivity is reached, so that the monocrystalline silicon may not be obtained. On the other hand, when the target resistivity at the start point of the straight body 1B is too high, the resistivity to decrease with the progress of pulling up the monocrystalline silicon may not decrease to the target low resistivity 1.4 mΩcm or less in the case (ii), 1.0 mΩcm or less in the case (iii), and 2.0 mΩcm or less in the case (iv)) of the first straight body 1BA.

The range of the resistivity to be set differs depending on the type of the n-type dopant because the likelihood of occurrence of the constitutional undercooling due to a magnitude of a degree of freezing point depression differs depending on an element of the n-type dopant, as shown by a formula (1). In other words, constitutional undercooling is more likely to occur in an element having a larger degree of freezing point depression.

$$\text{red phosphorus (P) arsenic (As) antimony (Sb)} \qquad (1)$$

When red phosphorus (P) or arsenic (As) is the main dopant, more than 50 mass % of the dopant is red phosphorus (P) or arsenic (As), however, other dopant(s) may be further added.

The target pull-up speed is preferably, for instance, in a range from 0.25 mm/min to 0.55 mm/min in the method (1), that is, when a method of slowing the pull-up speed of the monocrystalline silicon is used. When the pull-up speed is lower than 0.25 mm/min, since the time required for pulling up the monocrystalline silicon increases, the evaporation amount of the dopant from the dopant-added melt MD increases, so that a region of the target low resistivity cannot be obtained. When the pull-up speed is higher than 0.55 mm/min, dislocations are likely to occur due to the constitutional undercooling, so that the monocrystalline silicon having the target low resistivity cannot be obtained.

The controller 13 stores the set manufacturing conditions in tables in the memory 12, the tables corresponding to the diameter profile, the resistivity profile, the pull-up speed profile, and the heater temperature profile. In Step SP2 and subsequent steps, the controller 13 reads out the diameter profile and the like from the corresponding tables in the memory 12 and executes steps on a basis of the profiles read out.

In Step SP2, the controller 13 executes a preparation step. Subsequently, the controller 13 proceeds to Step SP3. In the preparation step, the controller 13 firstly controls a power source (not shown) that supplies electric power to the heater 23 to heat the crucible 22, thereby melting the silicon material and the dopant in the crucible 22 to generate the dopant-added melt MD.

Next, the controller 13 introduces Ar gas at a predetermined flow rate into the chamber 21 through the gas inlet 33A, and concurrently discharges gas contained in the chamber 21 through the gas outlet 33B by controlling a vacuum pump (not shown), thereby reducing the pressure in the chamber 21 to keep an inside of the chamber 21 in an inert atmosphere under the reduced pressure.

In Step SP3, the controller 13 controls the pull up drive unit 52 to lower the cable 51, thereby executing a dipping step of dipping the seed crystal 2 into the dopant-added melt MD. Subsequently, the controller 13 proceeds to Step SP4.

In Step SP4, the controller 13 controls the crucible driver 27 to rotate the crucible 22 in a predetermined direction, and concurrently controls the pull up drive unit 52 to pull up the cable 51 while rotating the cable 51 in a predetermined direction, thereby executing a neck-formation step of forming the neck 3. Subsequently, the controller 13 proceeds to Step SP5.

In Step SP5, the controller 13 controls the crucible driver 27 to rotate the crucible 22 in a predetermined direction, and concurrently controls the pull up drive unit 52 to pull up the cable 51 farther while rotating the cable 51 in a predetermined direction, thereby executing a shoulder-formation step of forming the shoulder 1A. Subsequently, the controller 13 proceeds to Step SP6.

In Step SP6, the controller 13 controls the crucible driver 27 to rotate the crucible 22 in a predetermined direction, and concurrently controls the pull up drive unit 52 to pull up the cable 51 still farther while rotating the cable 51 in a predetermined direction, thereby executing a straight-body-formation step of forming the straight body 1B. Subsequently, the controller 13 proceeds to Step SP7. This straight-body-formation step, which is the feature of the invention, will be described in detail later with reference to FIG. 5.

In Step SP7, the controller 13 controls the crucible driver 27 to rotate the crucible 22 in a predetermined direction, and concurrently controls the pull up drive unit 52 to pull up the cable 51 still farther while rotating the cable 51 in a predetermined direction, thereby executing a tail-formation step of forming the tail 10. Subsequently, the controller 13 proceeds to Step SP8.

In Step SP8, the controller 13 executes a separation step of separating the tail 10 of the monocrystalline silicon 1 from the dopant-added melt MD. Subsequently the controller 13 proceeds to Step SP9. In Step SP9, the controller 13 controls the pull up drive unit 52 to further pull up the cable 51, thereby executing a cooling step of cooling the monocrystalline silicon 1 separated from the dopant-added melt MD. Subsequently, the controller 13 proceeds to Step SP10.

In Step SP10, the controller 13 confirms that the cooled monocrystalline silicon 1 has been housed in the pull chamber 32, and then executes a draw up step of drawing out the monocrystalline silicon 1 from the pull chamber 32. Subsequently, a series of processes end.

Next, the straight-body-formation step, which is the feature of the invention, will be described with reference to the flowchart shown in FIG. 5.

As shown in FIG. 1, the straight body 1B includes: the first straight body 1BA having the diameter d1 the diameter-reduced portion 1B, and the second straight body 1BC having the diameter d2. The diameter d1 is defined as a value that is larger by 1% to 5% than the product diameter d0. The diameter d2 is defined as a value larger by 3.5% to 15% than the diameter d1 , more preferably a value larger by 3.5% to 10%. In short, d0<d1<d2 is satisfied.

When the diameter d1 is a value larger by less than 1% than the product diameter d0, in other words, when the diameter d1 is too close to the product diameter d0, the resistivity cannot be decreased to the target values, and a diameter of the first straight body 1BA actually obtained due to a diameter change at the time of pulling up the monocrystalline silicon is highly likely to be below the product diameter d0, so that a wafer product may not be obtained.

On the other hand, when the diameter d1 is set to a value larger by more than 5% than the diameter d0, the resistivity is too low, so that a product yield of the monocrystalline silicon having a target resistivity region decreases and the length of the first straight body 1BA decreases. Accordingly, the effects of the invention, that is, obtaining a longer straight body having a low resistivity cannot be sufficiently obtained.

When the diameter d2 is set to a value larger by less than 3.5% relative to the diameter d1, the effects of the invention cannot be sufficiently obtained. For instance, the resistivity cannot be decreased to the target value and monocrystal having a desired low resistivity may not be obtained. When the diameter d2 is set to a value larger by more than 15% than the diameter d1, risk of dislocations caused by contact of the monocrystalline silicon with the heat shield increases, and a grinding margin used for grinding an outer circumference of the second straight body 1BC to the product diameter d0 increases, resulting a large grinding loss. Accordingly, the diameter d2 is preferably 15% or less relative to the diameter d1. The diameter d2 is further preferably 10% or less relative to the diameter d1.

Figure 5:
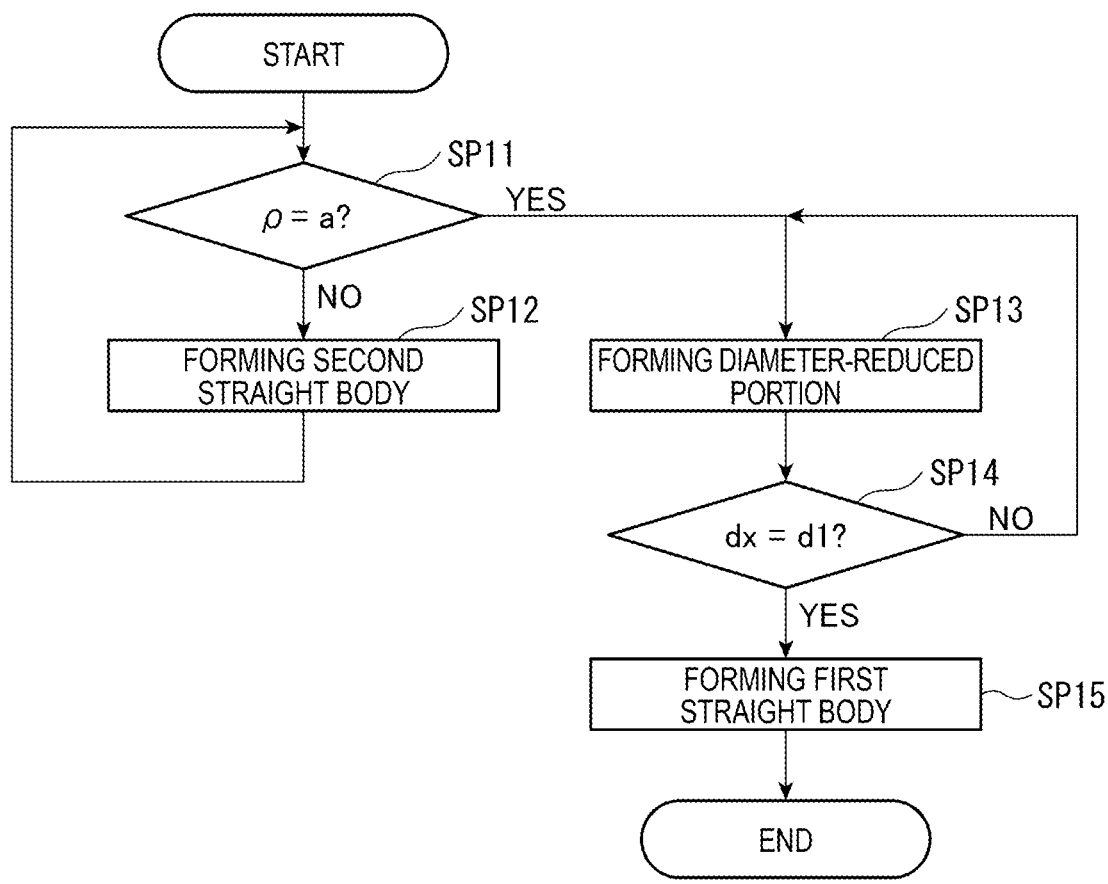
FIG. 5 is a flowchart for demonstrating an example of a manufacturing method of monocrystalline silicon according to an exemplary embodiment of the invention.
Figure 6:
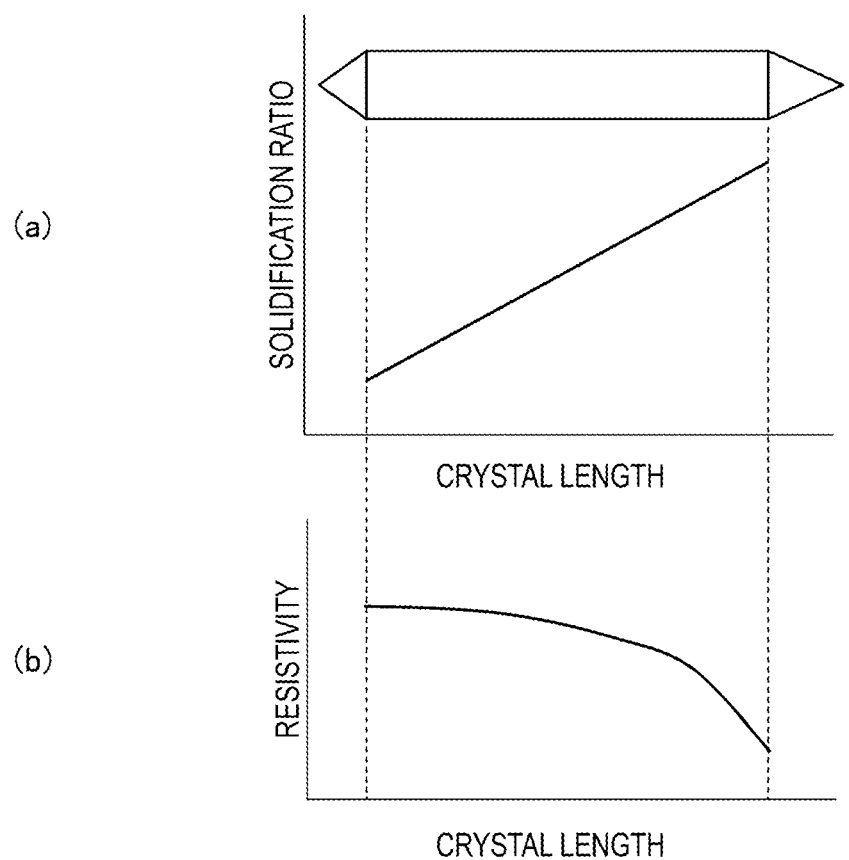
FIG. 6 is a graph showing an example of characteristics of a solidification ratio and a resistivity relative to a crystal length of monocrystalline silicon for demonstrating premises of findings of the invention.
Figure 7:
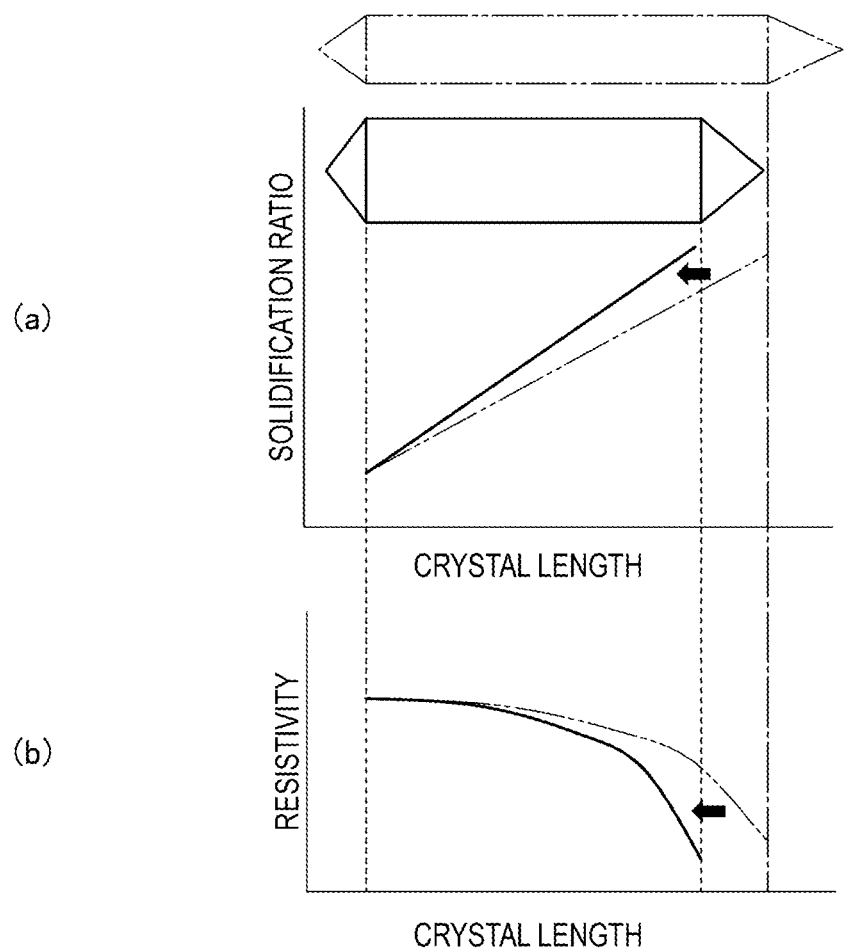
FIG. 7 is a graph showing an example of characteristics of a solidification ratio and a resistivity relative to a crystal length of monocrystalline silicon for demonstrating premises of findings of the invention.

Firstly, the controller 13 proceeds to the process in Step SP11 shown in FIG. 5 and judges whether a resistivity p of the monocrystalline silicon 1 at a present time is equal to the resistivity a (see FIG. 3) at which the diameter-reduced portion 1BB should be formed.

When the judgement result in Step SP11 is "NO," the controller 13 proceeds to Step SP12. On the other hand, when the judgement result in Step SP11 is "YES," specifically, when the resistivity p of the monocrystalline silicon 1 at the present time is equal to the resistivity a, the controller 13 proceeds to Step SP13.

In an example shown in FIG. 3, the resistivity of the monocrystalline silicon 1 at the start of forming the second straight body 1BC is 0.85 mΩcm and the resistivity a is 0.731 mΩcm. Accordingly, at the start of forming the second straight body 1BC, since the resistivity p of the monocrystalline silicon 1 is 0.85 mΩcm, which is not equal to the resistivity a of 0.731 mΩcm, the judgement result in Step SP11 is "NO" and the controller 13 proceeds to Step SP12.

In Step SP12, the controller 13 controls the crucible driver 27 to rotate the crucible 22 in a predetermined direction, and concurrently controls the pull up drive unit 52 to pull up the cable 51 still farther while rotating the cable 51 in a predetermined direction, thereby executing a second straight-body-formation step of forming the second straight body 1BC (see FIGS. 1 and 3). Subsequently, the controller 13 returns to Step SP11.

In Step SP11, the controller 13 again judges whether a resistivity p of the monocrystalline silicon 1 at a present time is equal to the resistivity a. When the resistivity p of the monocrystalline silicon 1 at the present time becomes equal to the resistivity a due to the progress of the formation of the second straight body 1BC along the resistivity profile shown in FIG. 3, the judgement result in Step SP11 is "YES" and the controller 13 proceeds to Step SP13.

In Step SP13, the controller 13 controls the crucible driver 27 to rotate the crucible 22 in a predetermined direction, and concurrently controls the pull up drive unit 52 to pull up the cable 51 still farther while rotating the cable 51 in a predetermined direction, thereby executing a diameter-reduced-portion-formation step of forming the diameter-reduced portion 1BB. Subsequently, the controller 13 proceeds to Step SP14. In the diameter-reduced-portion-formation step, for instance, the pull-up speed of the monocrystalline silicon 1 is set faster than that in the second straight-body-formation step.

In Step SP14, the controller 13 judges whether a measured diameter dx of the monocrystalline silicon 1 at a present time supplied from the diameter sensor 29 is equal to the diameter d1. When the judgement result in Step SP14 is "NO," the controller 13 returns to Step SP13. On the other hand, when the judgement result in Step SP14 is "YES," specifically, when the measured diameter dx at the present time supplied from the diameter sensor 29 is equal to the diameter d1, the controller 13 proceeds to Step SP15.

Accordingly, when a present time is the start point of forming the diameter-reduced portion 1BB, since the measured diameter dx at the present time supplied from the diameter sensor 29 is not equal to the diameter d1, the judgement result in Step SP14 is "NO" and the controller 13 returns to Step SP13.

In Step SP13, the controller 13 continues the diameter-reduced-portion-formation step. When the measured diameter dx at the present time supplied from the diameter sensor 29 becomes equal to the diameter d1 due to the progress of the formation of the diameter-reduced portion 1BB along the resistivity profile shown in FIG. 3, the judgement result in Step SP14 becomes "YES" and the controller 13 proceeds to Step SP15.

In Step SP15, the controller 13 controls the crucible driver 27 to rotate the crucible 22 in a predetermined direction, and concurrently controls the pull up drive unit 52 to pull up the cable 51 still farther while rotating the cable 51 in a predetermined direction, thereby executing a first straight-body-formation step of forming the first straight body 1BA (see FIGS. 1 and 3). Subsequently, the controller 13 ends the straight-body-formation step.

When the monocrystalline silicon 1 is manufactured by the above-described manufacturing method using red phosphorus as the dopant, an ingot of monocrystalline silicon 1 having a resistivity of less than 0.67 mΩcm is obtained from a part of the first straight body 1BA. The part of the first straight body 1BA is cut out into a silicon wafer using a wire saw or the like. The cut silicon wafer is subjected to a lapping step and a polishing step, whereby the silicon wafer having a resistivity of less than 0.67 mΩcm is obtainable.

After this silicon wafer is further subjected to an anneal heat treatment, an epitaxial growth film is formed on a surface of the silicon wafer to manufacture an epitaxial silicon wafer and ship the epitaxial silicon wafer to a customer. The customer manufactures a semiconductor device using this epitaxial silicon wafer.

Thus in the exemplary embodiment, as shown in FIG. 1, the monocrystalline silicon 1 is manufactured including: the first straight body 1BA having the diameter d1 larger by from 1% to 5% than the product diameter d0, the diameter-reduced portion 1BB, and the second straight body 1BC having the diameter d2 larger by from 3.5% to 15% than the diameter d1.

When the diameter d1 is a value larger by less than 1% than the product diameter d0, in other words, the diameter d1 is too close to the product diameter d0, the resistivity cannot be decreased to the target values, and the diameter of the first straight body 1BA actually obtained due to a diameter change at the time of pulling up the monocrystalline silicon is highly likely to be below the product diameter d0, so that a wafer product may not be obtained.

On the other hand, when the diameter d1 is set to a value larger by more than 5% than the diameter d0, the resistivity is too low, so that a product yield of monocrystalline silicon having a target resistivity region decreases and the length of the first straight body 1BA decreases. Accordingly, the effects of the invention of obtaining a longer straight body having a low resistivity cannot be sufficiently obtained.

When the diameter d2 is set to a value larger by less than 3.5% than the diameter d1, the effects of the invention cannot be sufficiently obtained. For instance, the resistivity cannot be decreased to the target value and monocrystal having a desired low resistivity may not be obtained. When the diameter d2 is set to a value larger by more than 15% than the diameter d1, risk of dislocation caused by contact of the monocrystalline silicon with the heat shield increases, and a grinding margin used for grinding an outer circumference of the second straight body 1BC to the product diameter d0 increases, resulting a large grinding loss. Accordingly, the diameter d2 is preferably 15% or less relative to the diameter d1. The diameter d2 is further preferably 10% or less relative to the diameter d1.

Specifically, firstly, in formation step of the second straight body 1BC having the diameter d2, the consumption amount of the dopant-added melt MD per crystal-length-directional length of the monocrystalline silicon 1 is increased to increase the dopant concentration in the dopant-added melt MD due to the segregation phenomenon, thereby considerably decreasing the resistivity of the bottom portion of the second straight body 1BC. Next, the first straight body 1BA having the diameter d1 is formed, whereby the bottom portion of the first straight body 1BA has an extremely low resistivity that has not been obtained conventionally. Thus, the monocrystalline silicon 1 having a low resistivity and added with an n-type dopant at a high concentration can be manufactured at a high yield rate.

EXAMPLES

The manufacturing method of the monocrystalline silicon of the invention will be further described with reference to Examples. In Examples, the semiconductor crystal manufacturing device having the structure described in the above exemplary embodiment was used for actually conducting experiments, whereby effects of the semiconductor crystal manufacturing device were verified.

(i) Case Where Product Diameter D0 is 200 mm and Main Dopant is Red Phosphorus (P)

A resistivity at the start point of the straight body 1B was controlled to a range from 0.8 mΩcm to 1.05 mΩcm. Subsequently, the resistivity was decreased as the monocrystalline silicon 1 was pulled up and grown, whereby the second straight body 1BC was formed. While the resistivity was further decreased, the first straight body 1BA was formed and a resistivity of a part of the first straight body 1BA was in a range from 0.5 mΩcm to 0.7 mΩcm to obtain the monocrystalline silicon 1.

In Example (i), as compared with a case where the entire straight body 1B of the monocrystalline silicon 1 was formed having a diameter d2, an acquisition ratio of the first straight body 1BA having the resistivity in a range from 0.5 mΩcm to 0.7 mΩcm was improved by about 10%.

(ii) Case Where Product Diameter D0 is 200 mm And Main Dopant Is Arsenic (As)

The resistivity at the start point of the straight body 1B was controlled to a range from 1.9 mΩcm to 2.3 mΩcm. Subsequently, the resistivity was decreased as the monocrystalline silicon 1 was pulled up and grown, whereby the second straight body 1BC was formed. While the resistivity was further decreased, the first straight body 1BA was formed and a resistivity of a part of the first straight body 1BA was in a range from 1.2 mΩcm to 1.4 mΩcm to obtain the monocrystalline silicon 1.

In Example (ii), as compared with the case where the entire straight body 1B of the monocrystalline silicon 1 was formed having the diameter d2, an acquisition ratio of the first straight body 1 BA having the resistivity in a range from 1.2 mΩcm to 1.4 mΩcm was improved by about 5%.

(iii) Case Where Product Diameter DO Is 300 mm And Main Dopant Is Red Phosphorus (P)

The resistivity at the start point of the straight body 1B was controlled to a range from 1.2 mΩcm to 1.7 mΩcm. Subsequently, the resistivity was decreased as the monocrystalline silicon 1 was pulled up and grown, whereby the second straight body 1BC was formed. While the resistivity was further decreased, the first straight body 1BA was formed and a resistivity of a part of the first straight body 1BA was in a range from 0.8 mΩcm to 1.0 mΩcm to obtain the monocrystalline silicon 1.

In Example (iii), as compared with the case where the entire straight body 1B of the monocrystalline silicon 1 was formed having the diameter d2, an acquisition ratio of the first straight body 1BA having the resistivity from 0.8 mΩcm to 1.0 mΩcm was improved by about 10%.

(iv) Case Where Product Diameter DO Is 300 mm And Main Dopant Is Arsenic (As)

The resistivity at the start point of the straight body 1B was controlled to a range from 2.5 mΩcm to 3.1 mΩcm. Subsequently, the resistivity was decreased as the monocrystalline silicon 1 was pulled up and grown, whereby the second straight body 1BC was formed. While the resistivity was further decreased, the first straight body 1BA was formed and the resistivity of a part of the first straight body 1BA was from 1.7 mΩcm to 2.0 mΩcm to obtain the monocrystalline silicon 1.

In Example (iv), as compared with the case where the entire straight body 1B of the monocrystalline silicon 1 was formed having a diameter d2, an acquisition ratio of the first straight body 1BA having the resistivity from 1.7 mΩcm to 2.0 mΩcm was improved by about 20%.

It should be noted that the specific arrangement of the invention, which is not limited by the exemplary embodiments of the invention described in detail with reference to the attached drawings, encompasses design modifications and the like as long as such modifications are compatible with an object of the invention.

For instance, the monocrystalline silicon 1 may be manufactured by the same process as that in the above exemplary embodiments by using a magnetic field applied Czochralski method (hereinafter, abbreviated as a "MCZ method"). In this case, it is sufficient that a pair of solenoid coils are disposed outside the chamber 21 shown in FIG. 2 in a manner to oppose each other across the crucible 22, thereby suppressing a natural convection in the dopant-added melt MD by using a transverse magnetic field.

Use of the MCZ method can reduce temperature unevenness and turbulent flow phenomenon in the dopant-added melt MD, so that the first straight body 1BA and the second straight body 1 BC can be reliably pulled up without generating dislocations. A timing of applying a transverse magnetic field may be, for instance, the start of forming the straight body 1B.

When the MCZ method is used, a magnetic flux density is preferably in a range from 0.2T to 0.4T. When the magnetic flux density is less than 0.2T, the effect of applying the magnetic field cannot be exhibited due to a decrease in the effect of suppressing the convection in the dopant-added melt MD. When the magnetic flux density is more than 0.4T, such a large magnetic field may not be applicable due to limitations of the apparatus.

In the above exemplary embodiment, controlling of the gas flow rate of Ar gas and the furnace internal pressure in the chamber 21 for lowering the resistivity of the monocrystalline silicon 1 is not performed. However, the invention is not limited thereto. The monocrystalline silicon 1 may be shaped as shown in FIG. 1, and the gas flow rate of Ar gas may be reduced, the furnace internal pressure may be increased, or both of these means may be employed. With this configuration, synergistic effects of these means can further lower the resistivity of the monocrystalline silicon 1.

When the first straight body 1BA is formed, the gas flow rate of Ar gas is increased and/or the furnace internal pressure is decreased to promote evaporation of the dopant from the dopant-added melt MD, so that the inclination of the curve shown in FIG. 3 becomes moderate. In other words, the resistivity distribution in the crystal length direction in the first straight body 1BA can be made uniform as compared with the resistivity distribution in the crystal length direction in the second straight body 1BC. As a result, more wafers each having a desired resistivity can be cut out from the first straight body 1BA.

Specifically, when the second straight body 1BC is formed, the Ar flow rate is set in a range from 50 L/min to 150 L/min and the furnace internal pressure is set in a range from 40 kPa to 80 kPa. On the other hand, when the first straight body 1BA is formed, the Ar flow rate is made larger or the furnace internal pressure is made smaller than the Ar flow rate or the furnace internal pressure when second straight body 1BC is formed: the Ar flow rate is set in a range from 50 L/min to 200 L/min or the furnace internal pressure is set in a range from 20 kPa to 80 kPa (preferably in a range from 30 kPa to 40 kPa).

In the above exemplary embodiment, the case where monocrystalline silicon 1 is manufactured to have a 200-mm product diameter d0 and the case where monocrystalline silicon 1 is manufactured to have a 300-mm product diameter d0 are exemplarily shown. However, application of the invention is not limited to these cases. The invention is also applicable to, for instance, a case where monocrystalline silicon 1 is manufactured to have a 450-mm product diameter d0.

The invention claimed is:

1. A manufacturing method of monocrystalline silicon, comprising:
    pulling up monocrystalline silicon from a dopant-added melt in which a volatile dopant is added to a silicon melt and growing the monocrystalline silicon according to Czochralski process, the monocrystalline silicon used for manufacturing a wafer, wherein:
        the monocrystalline silicon comprises a shoulder, a straight body, and a tail that are sequentially connected, and
        the straight body comprises: a first straight body having a first diameter;
        and a second straight body provided closer to the shoulder than the first straight body is and having a second diameter larger than the first diameter by from 3.5% to 15%, and
        a diameter of a wafer manufactured from the first straight body is identical to a diameter of a wafer manufactured from the second straight body;
    setting a resistivity at a start point of the straight body connected to the shoulder to a first resistivity; and
    subsequently, pulling up and growing the monocrystalline silicon to form the first straight body, and setting a resistivity at a start point of the first straight body to a second resistivity lower than the first resistivity.

2. The manufacturing method of monocrystalline silicon according to claim 1, wherein:
    the volatile dopant is red phosphorus,
    the monocrystalline silicon is used for manufacturing a wafer having a diameter of 200 mm, the second diameter is larger than the first diameter by from 3.5% to 15%,
    a diameter of a wafer manufactured from the first straight body and a diameter of a wafer manufactured from the second straight body are each 200 mm,
    the first resistivity is in a range from 0.8 mΩcm to 1.05 mΩcm, and
    the second resistivity is in a range from 0.5 mΩcm to 0.7 mΩcm.

3. The manufacturing method of monocrystalline silicon according to claim 1, wherein:
    the volatile dopant is arsenic,
    the monocrystalline silicon is used for manufacturing a wafer having a diameter of 200 mm, the second diameter is larger than the first diameter by from 3.5% to 15%,
    a diameter of a wafer manufactured from the first straight body and a diameter of a wafer manufactured from the second straight body are each 200 mm,
    the first resistivity is in a range from 1.9 mΩcm to 2.3 mΩcm, and
    the second resistivity is in a range from 1.2 mΩcm to 1.4 mΩcm.

4. The manufacturing method of monocrystalline silicon according to claim 1, wherein:
    the volatile dopant is red phosphorus,
    the monocrystalline silicon is used for manufacturing a wafer having a diameter of 300 mm, the second diameter is larger than the first diameter by from 3.5% to 15%,
    a diameter of a wafer manufactured from the first straight body and a diameter of a wafer manufactured from the second straight body are each 300 mm,
    the first resistivity is in a range from 1.2 mΩcm to 1.7 mΩcm, and
    the second resistivity is in a range from 0.8 mΩm to 1.0 mΩcm.

5. The manufacturing method of monocrystalline silicon according to claim 1, wherein:
    the volatile dopant is arsenic,
    the monocrystalline silicon is used for manufacturing a wafer having a diameter of 300 mm, the second diameter is larger than the first diameter by from 3.5% to 15%,
    a diameter of a wafer manufactured from the first straight body and a diameter of a wafer manufactured from the second straight body are each 300 mm,
    the first resistivity is in a range from 2.5 mΩcm to 3.1 mΩcm, and
    the second resistivity is in a range from 1.7 mΩcm to 2.0 mΩcm.

6. The manufacturing method of monocrystalline silicon according to claim 1, wherein in forming the first straight body, evaporation of the dopant from the dopant-added melt is more promoted than in forming the second straight body.

* * * * *